(12) United States Patent
Kim et al.

(10) Patent No.: US 7,197,202 B2
(45) Date of Patent: Mar. 27, 2007

(54) OPTICAL PRINTED CIRCUIT BOARD FOR LONG-DISTANCE SIGNAL TRANSMISSION

(75) Inventors: Young-Woo Kim, Chungchungnam-do (KR); Byoung-Ho Rhee, Daejeon (KR); Young-Sang Cho, Chungchungbuk-do (KR); Dek-Gin Yang, Chungchungbuk-do (KR); Kyu-Hyok Yim, Chungchungbuk-do (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 118 days.

(21) Appl. No.: 10/610,818

(22) Filed: Jul. 2, 2003

(65) Prior Publication Data

US 2004/0120631 A1    Jun. 24, 2004

(30) Foreign Application Priority Data

Dec. 24, 2002    (KR)    ............... 10-2002-0083611

(51) Int. Cl.
G02B 6/12    (2006.01)
(52) U.S. Cl. ........................................ 385/14
(58) Field of Classification Search ............. 385/14, 385/27, 129–132
See application file for complete search history.

(56) References Cited

U.S. PATENT DOCUMENTS

| | | | | |
|---|---|---|---|---|
| 5,117,470 A | * | 5/1992 | Inoue et al. | .............. 385/14 |
| 5,221,984 A | * | 6/1993 | Furuyama et al. | .......... 398/161 |
| 5,982,968 A | * | 11/1999 | Stulpin | ...................... 385/114 |
| 6,048,107 A | * | 4/2000 | Pubanz | ...................... 385/92 |
| 6,295,400 B1 | * | 9/2001 | Shahid | ...................... 385/114 |
| 2001/0026665 A1 | * | 10/2001 | Ando et al. | .................. 385/94 |
| 2002/0061154 A1 | * | 5/2002 | Tsukamoto et al. | ........... 385/14 |
| 2003/0123827 A1 | * | 7/2003 | Salerno et al. | .............. 385/129 |
| 2003/0128922 A1 | * | 7/2003 | Kolodziejski et al. | ........ 385/27 |
| 2004/0218889 A1 | * | 11/2004 | Shelnut et al. | .............. 385/143 |

* cited by examiner

*Primary Examiner*—Ellen E. Kim
(74) *Attorney, Agent, or Firm*—Morgan, Lewis, & Bockius, LLP

(57) ABSTRACT

Disclosed is an optical printed circuit board (PCB) for long-distance signal transmission, which is combined with fiber blocks and pipe blocks embedded in opto-via holes to form a multi-layered optical PCB, and transmits an optical signal using a fiber ribbon when an optical signal transmission distance between layers constituting the multi-layered optical PCB is longer than a length of an optical waveguide element used in conjunction with a silicon substrate. The optical PCB comprises a base substrate including an insulating material, a copper foil, and an opto-via hole, and an optical signal transmission member attached to the base substrate to horizontally transmit an optical signal. An optical signal connection member is horizontally connected to the optical signal transmission member to transmit the optical signal across a desired distance. Therefore, an optical PCB of the present invention is advantageous in that an optical waveguide, a pipe block, and a fiber block are horizontally and optionally arranged and attached to each other, thereby transmitting an optical signal across a longer distance than a length of a silicone substrate.

13 Claims, 11 Drawing Sheets

OPTICAL PRINTED CIRCUIT BOARD FOR LONG-DISTANCE SIGNAL TRANSMISSION

BACKGROUND OF THE INVENTION

1. Field of the Invention

The present invention pertains, in general, to an optical printed circuit board (PCB) for long-distance signal transmission and, in particular, to an optical PCB for long-distance signal transmission, which is combined with fiber blocks and pipe blocks embedded in opto-via holes to form a multi-layered optical PCB, and transmits an optical signal using a connection member such as a fiber ribbon when an optical signal transmission distance between layers constituting the multi-layered optical PCB is longer than a length of an optical waveguide element used in conjunction with a silicon substrate.

2. Description of the Prior Art

As well known to those skilled in the art, PCBs are circuit boards in which various electronic elements are densely mounted on a surface of a flat plate consisting of a phenol or epoxy resin, and electrically connected to each other. A method of manufacturing such a PCB includes attaching a copper foil to one side of the phenol or epoxy resin insulating substrate, etching the resulting substrate to form a desired circuit pattern (a portion other than the circuit pattern is eroded and removed), and piercing via-holes for receiving the electronic elements on the etched substrate.

Further, the PCBs are classified into three types according to the number of patterned layers constituting the PCB: single-sided PCBs, double-sided PCBs, and multi-layered PCBs. The higher the number of the patterned layers is, the higher the number of electronic elements mounted on the patterned layer will be. Of the three kinds of PCBs, accordingly, the multi-layered PCBs are applied to sophisticated products, and each comprise three or more layers with a conductive pattern in such a way that insulating layers alternate with the patterned layers.

Meanwhile, a conventional PCB comprises a copper plate on which a circuit pattern is formed, and an inner and an outer layer. However, recently, an electro-optical circuit board (EOCB) is frequently used instead of the conventional PCB. At this time, the EOCB is formed by inserting an optical waveguide into the PCB, and the optical waveguide for transmitting and receiving optical signals comprises polymer and glass fiber. In other words, the EOCB is a PCB into which the optical waveguide and a glass plate are inserted after the circuit pattern is already formed on the PCB, and it transmits and receives both electrical signals and optical signals. Additionally, the EOCB functions to convert optical signals into electrical signals so as to store data or process signals in an element mounted on the PCB, and very high-speed data telecommunication is realized when the electrical signal is interfaced with the optical signal in the PCB.

Various coupling methods have been suggested to smoothly transmit and receive optical signals between layers of the multi-layered PCB, and examples of the coupling methods include a direct writing method, a beam reflection method, a reflecting mirror method, and a direct coupling method.

A detailed description of the optical interfacing in the conventional PCB will be given, below.

Figure 1:
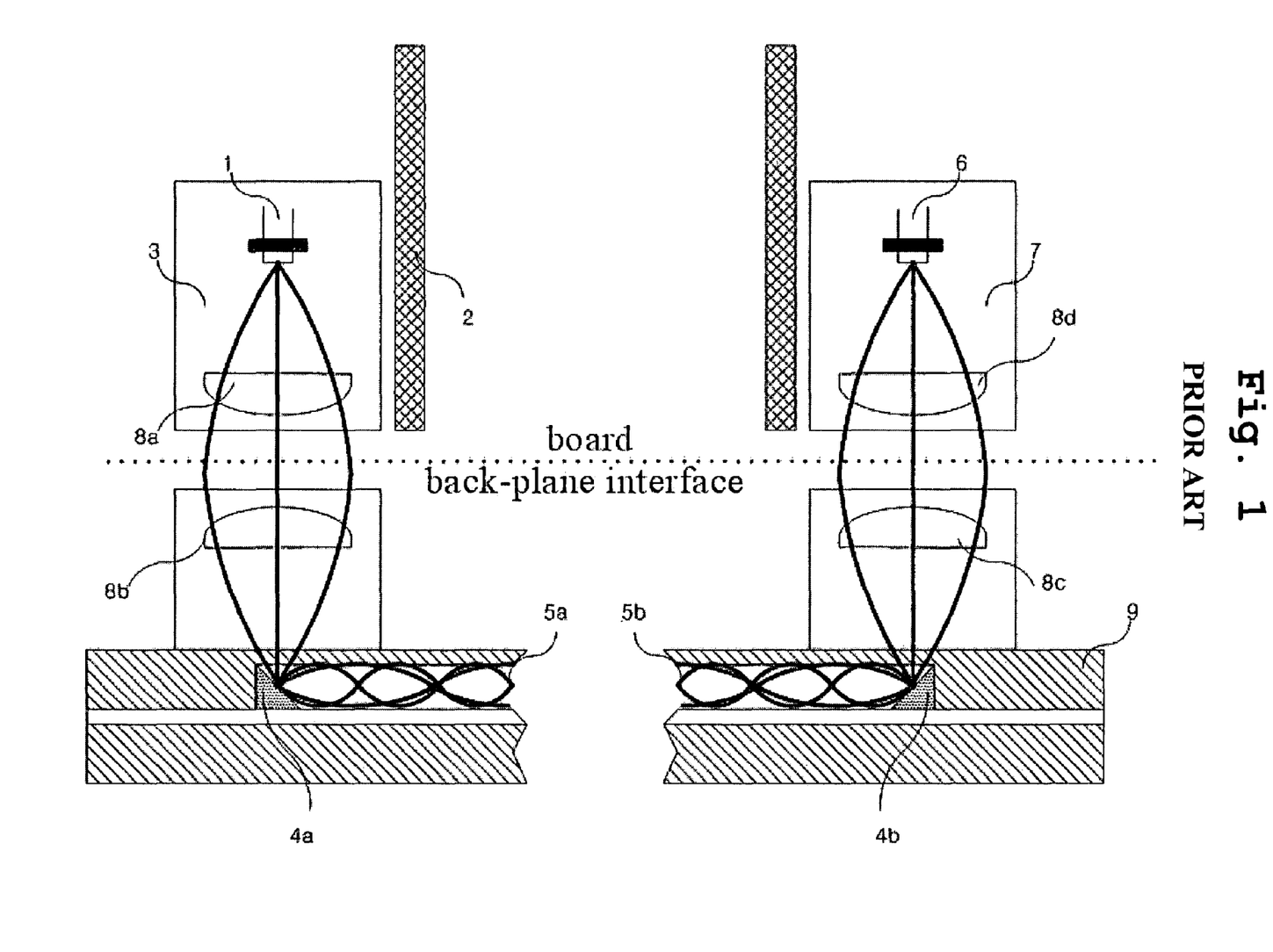
FIG. 1 schematically illustrates a light interfacing according to a conventional technology.

FIG. 1 schematically illustrates a beam coupling in the case of using a beam reflecting micro mirror.

With reference to FIG. 1, an electrical signal transmitted from a processor board 2 is converted into an optical signal by a laser diode 1 in a transmitting module 3, transmitted via left lenses 8a, 8b, and then reflected by a left micro mirror 4a inserted into the PCB. The reflected signal is transmitted through the optical waveguide, reflected by a right reflecting mirror 4b, and then transmitted through right lenses 8c, 8d to a photo diode 6 in a receiving module 7. At this time, the optical waveguide is embedded within a low loss multimode polymer waveguide core 5a, 5b, and a waveguide clad 9 is formed on an upper and a lower part of the core. Therefore, the electrical signal transmitted from the left processor board 2 is converted into the optical signal and transmitted to a photo diode 6, and the optical signal is then converted into the electrical signal by the photo diode 6 and transmitted to a right processor board.

Hereinafter, there will be described the conventional multi-layered PCB in which the optical signals are transmitted between layers constituting the PCB.

Figure 2A:
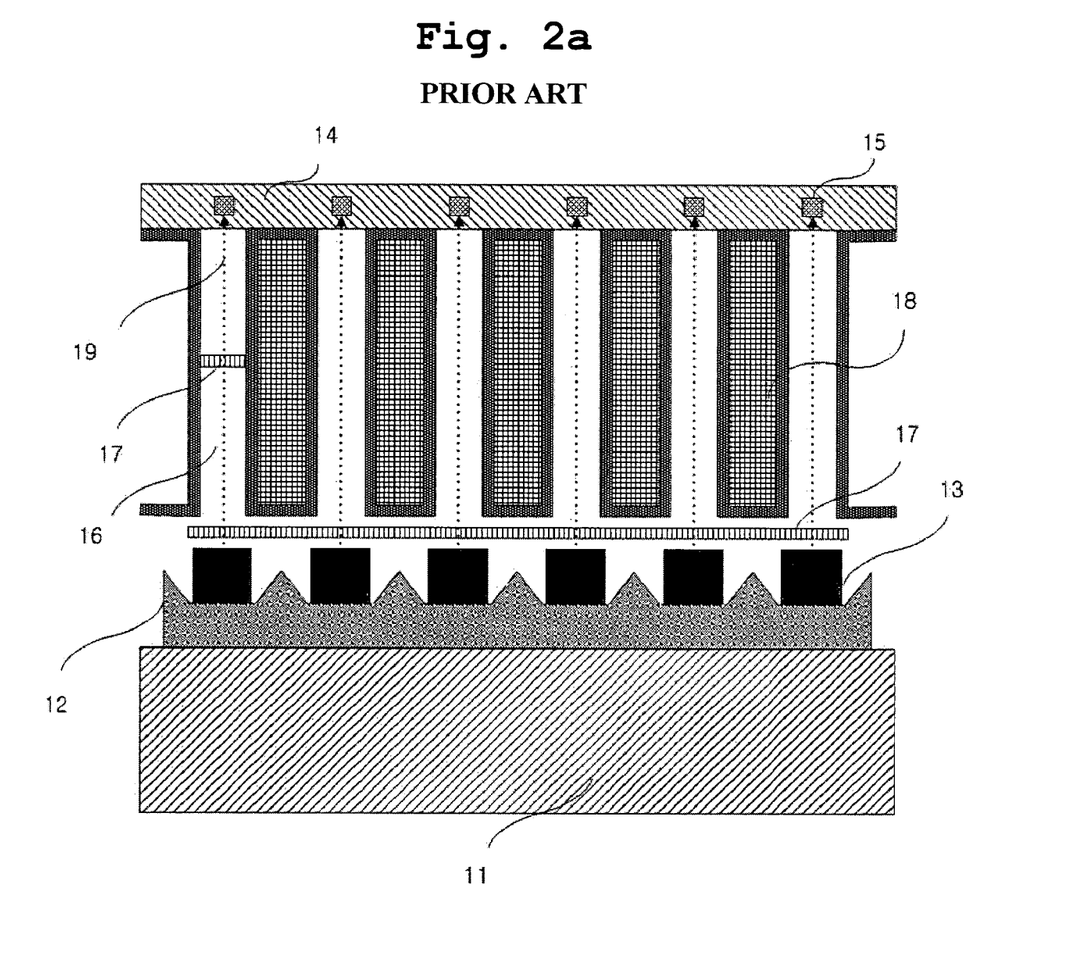
FIGS. 2a and 2b are a front and a side sectional view of an optical multi-layered PCB, which show connection of optical signals in the optical multi-layered PCB, respectively, according to the conventional technology.
Figure 2B:
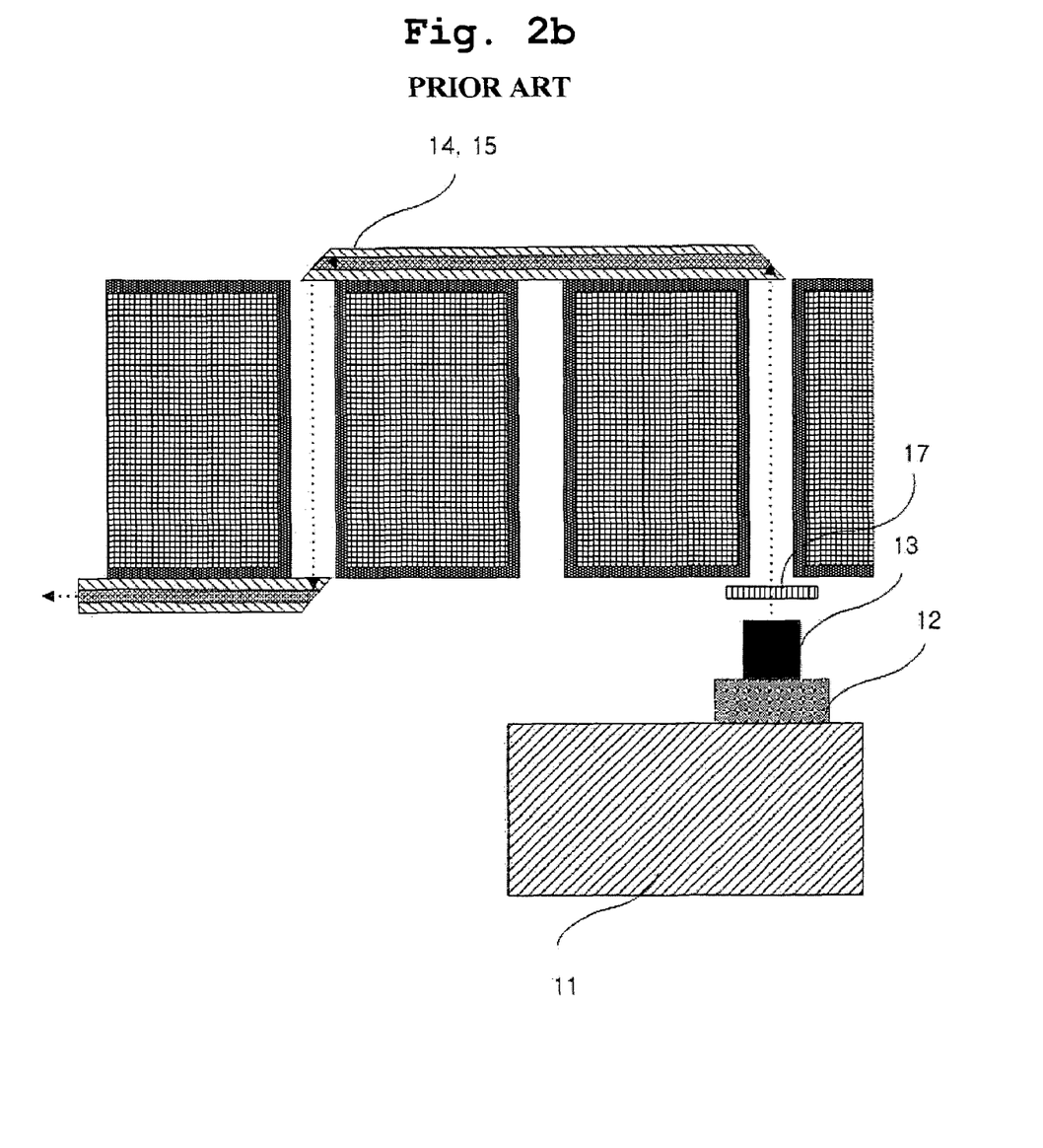

FIGS. 2a and 2b are a front and a side sectional view of the conventional multi-layered PCB in which the optical signals are transmitted between layers of the PCB, respectively.

Referring to FIGS. 2a and 2b, transmission of the signals between layers of the PCB is realized in such a way that a beam emitted from a vertical-cavity surface-emitting laser 13 (hereinafter, referred to as "VCSEL") acting as a light source element is focused by a micro-lens 17, and then transmitted through opto-via holes 16 of the PCB into the optical waveguide 14, 15. At this time, a silicon optical bench 12 (SiOB) is formed on the PCB 11. The SiOB 12 is a common designation of silicon wafers, and is applied to an optical communication module used to package optical elements. Alternatively, a polymer substrate may be used instead of the SiOB 12. The optical waveguide consists of a clad 14 and cores 15, the optical signals 19 emitted from the VCSEL 13 through the micro-lens 17 are transmitted to the optical waveguide positioned on another layer of the PCB. At this time, the opto-via hole 16 is insulated with an insulating material 18. Furthermore, the micro-lens 17' may be embedded in the opto-via hole 16 so as to improve the transmission of the optical signals.

The VCSEL 13 is used as a light source of an optical module for transmission and amplification of light source data, in which a circular laser beam is perpendicularly emitted to a surface of the substrate. Conventionally, an LED and an edge-emitting laser diode have been widely used as the VCSEL and, since 1990, a surface-emitting laser (SEL) has been used in optical fiber communication, interfacing, and parallel processing of mass-information instead.

However, the conventional VCSELs are disadvantageous in that the micro-lens 17 should be used if the transmission of the optical signal 19 is conducted through the opto-via holes 16, and their maximum allowable wavelength is 200 μm. Furthermore, it is difficult to embed a curved reflecting mirror or prism used in coupling of waveguide elements into the multi-layered PCB, and there is a problem of misalignment between the curved reflecting mirror or prism and the PCB when a plurality of mechanical drills are used in parallel to pierce the multi-layered PCB so as to connect multi-channel signals to each other. In other words, it is difficult to limit a light emitting distance from the VCSEL or photo diode within a range of 60 to 200 μm in a free space and to locate the micro-lens, the curved reflecting mirror, or the prism in the proper place so as to connect the VCSEL or photo diode to the optical waveguide or optical fiber in the multi-layered PCB.

Additionally, it is impossible to transmit the optical signal between locations more than 30 cm apart because a length of a silicon substrate, that is, a wafer, is 30 cm or less when a plastic polymer used as a material of the optical waveguide is spin-coated on the silicon substrate.

SUMMARY OF THE INVENTION

Therefore, the present invention has been made keeping in mind the above disadvantages occurring in the prior arts, and an object of the present invention is to provide an optical PCB, in which any two or all three of an optical waveguide, a pipe block, and a fiber block are horizontally arranged and attached to each other, thereby transmitting an optical signal a longer distance than a length of a silicone substrate.

It is another object of the present invention to provide an optical PCB for long-distance signal transmission, in which any two or all three of an optical waveguide, a pipe block, and a fiber block are directly attached to each other to prevent misalignment between them.

It is yet another object of the present invention to provide an optical PCB for long-distance signal transmission, in which optical fibers are easily and directly applied to a copper foil or an epoxy substrate to be desirably arranged.

Based on the present invention, the above objects can be accomplished by providing an optical PCB for long-distance signal transmission, comprising a base substrate including an insulating material, a copper foil, and an opto-via hole, and an optical signal transmission member attached to the base substrate to horizontally transmit an optical signal. An optical signal connection member is horizontally connected to the optical signal transmission member to transmit the optical signal across a desired distance.

At this time, the optical PCB may further comprise an attachment member for attaching the optical signal transmission member to the optical signal connection member, and it is preferable that the attachment member is cured by ultra violet rays and has light transmissivity of 95% or higher.

The optical signal transmission member may be selected from the group consisting of the optical waveguide element, the pipe block, and the fiber block.

The optical signal connection member may be selected from the group consisting of the optical waveguide element, the pipe block, and the fiber block.

As well, the optical signal transmission member and the optical signal connection member are fixedly embedded in a stepped part of the base substrate.

Furthermore, a core of the optical signal transmission member lies on the same horizontal axis as that of the optical signal connection member.

Moreover, at least one optical signal connection member is packaged by a fiber ribbon attached to the base substrate.

Additionally, the above objects can be accomplished by providing an optical printed circuit board for long-distance signal transmission, comprising a base substrate including an insulating material, a copper foil, and an opto-via hole, and an optical signal transmission member including a optical signal connection block with a plurality of grooves and optical fibers embedded in the grooves, and attached to the base substrate so as to realize horizontal transmission of the optical signal. At this time, the optical signal transmission member is partially embedded in the insulating material of the base substrate. Additionally, the optical fibers in the optical signal transmission member are partially exposed and attached to the copper foil of the base substrate.

The optical signal transmission member may be selected from the group consisting of an optical waveguide element, a pipe block, and a fiber block, and the optical signal transmission member is fixedly embedded in a stepped part of the base substrate.

Therefore, the optical PCB of the present invention is advantageous in that an optical waveguide, a pipe block, and a fiber block are horizontally and optionally arranged and attached to each other, thereby transmitting an optical signal across a longer distance than a length of a silicone substrate. Other advantages are that the optical waveguide, the pipe block, and the fiber block are directly and optionally attached to each other to prevent misalignment between them.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Reference now should be made to the drawings, in which the same reference numerals are used throughout the different drawings to designate the same or similar elements.

According to the present invention, long-distance transmission of an optical signal is realized by a direct contact coupling method in which optical fibers are embedded in a core of a fiber block or pipe block or packaged by a fiber ribbon to maximize a horizontal transmission length of the optical signal.

Figure 3A:
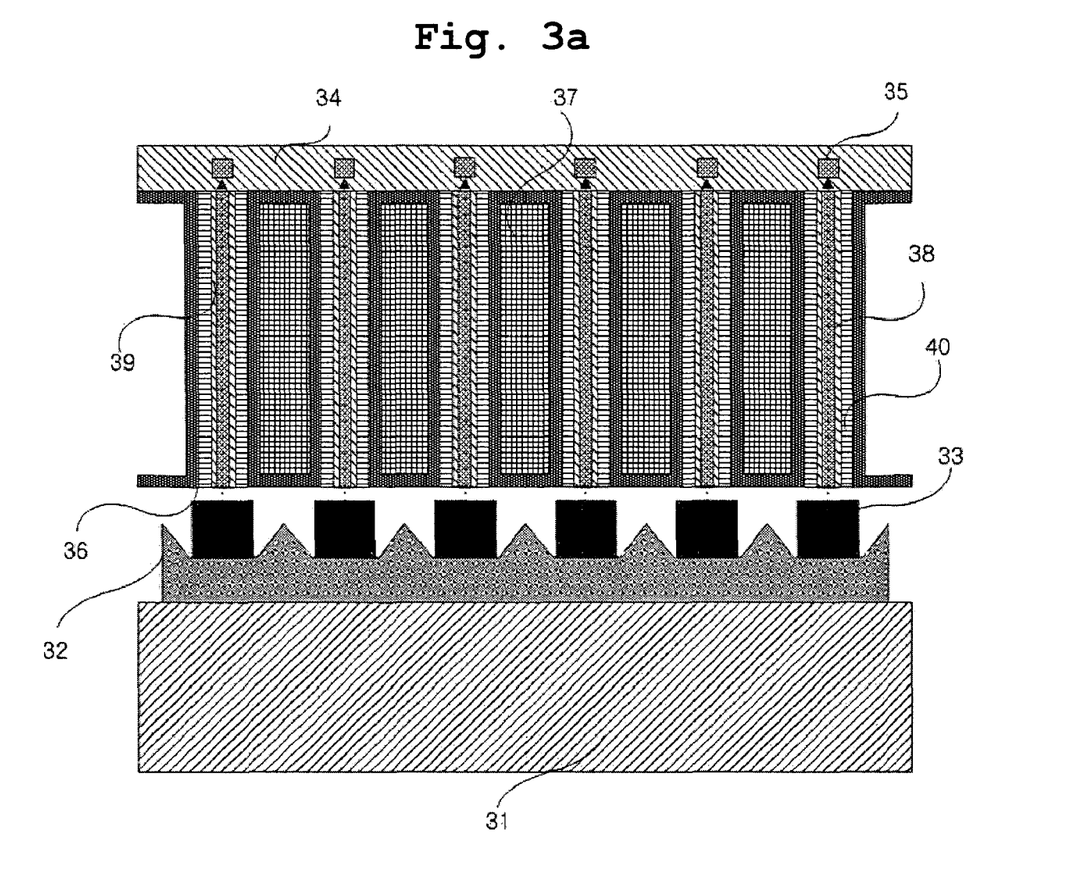
FIGS. 3a and 3b are respectively a front and a side sectional view of an optical multi-layered PCB into which optical fibers are embedded using a fiber block or a pipe block to transmit optical signals between layers of the optical multi-layered PCB according to the present invention.
Figure 3B:
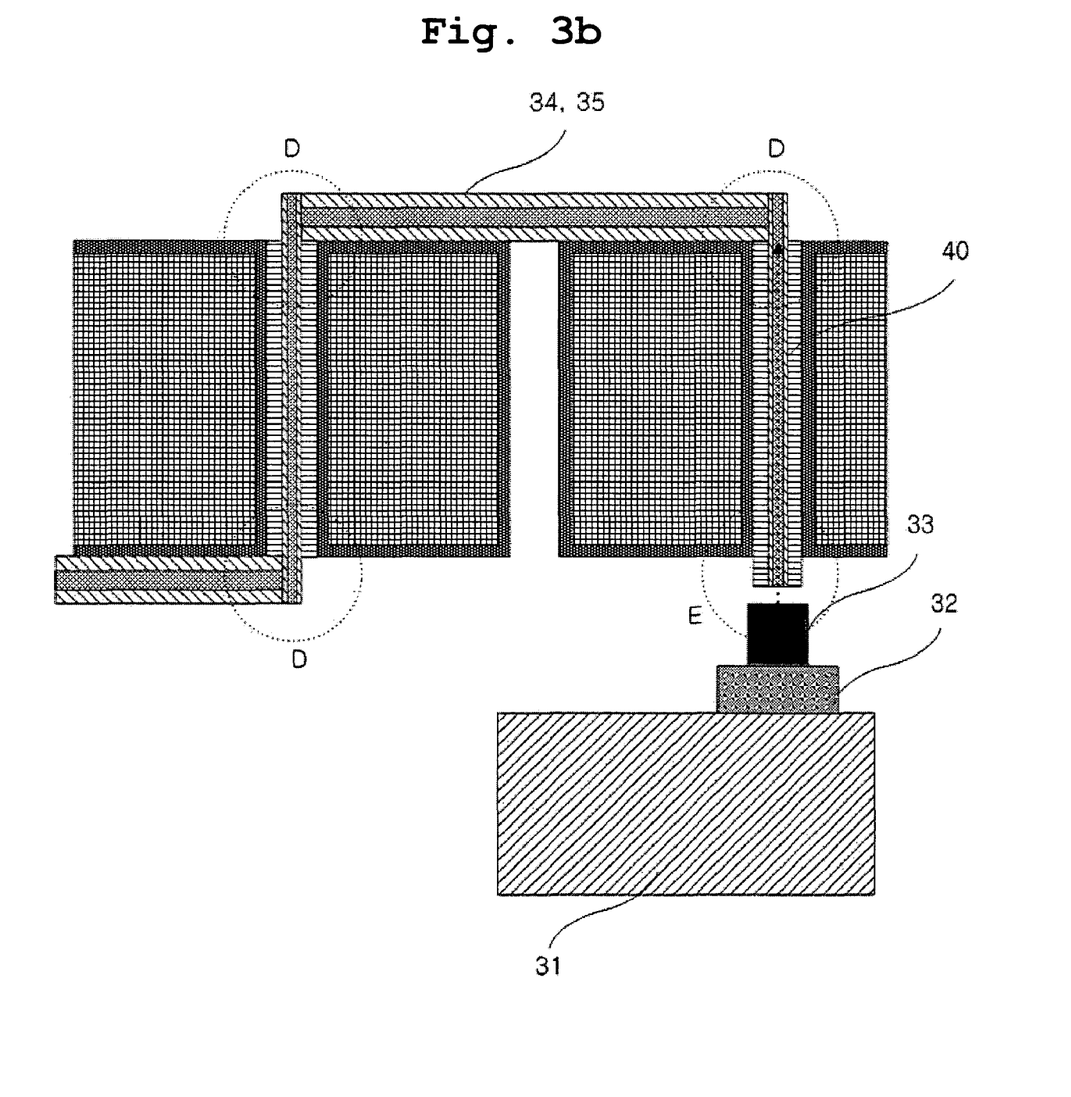

With reference to FIGS. 3a and 3b, there are illustrated a front and a side sectional view of an optical multi-layered PCB into which optical fibers are embedded using a fiber block or a pipe block to transmit optical signals between layers of the optical multi-layered PCB according to the present invention.

When a beam is emitted from a VCSEL 33 acting as a light source, it is transmitted through the optical fiber 39 in the fiber or pipe block 40 embedded in an opto-via hole 36 into optical waveguide elements 34, 35. Using the same procedure, transmission of the optical signal is conducted between layers constituting the optical multi-layered PCB. At this time, an SiOB 32 is formed on the PCB 31. The optical waveguide elements 34, 35 generally consist of a clad 34 and a plurality of cores 35, and the optical signal 38 emitted from the VCSEL 33 is transmitted through the optical fiber 39 embedded in the fiber or pipe block 40 to the optical waveguide elements 34, 35 and then transmitted to the optical waveguide elements of other layers constituting the multi-layered PCB. Additionally, the opto-via holes 36 in the multi-layered PCB are isolated from each other by insulating layers 37. Furthermore, in the present invention, a lens is not needed because the light is directly transmitted through the optical fiber 39, unlike a conventional technology. However, an optical signal input end of the fiber block for optical signal connection between different layers of the multi-layered PCB is 60 μm or less distant from the VCSEL and emits the beam to the fiber or pipe block 40.

As described above, in the multi-layered PCB according to the present invention, the fiber or pipe block 40 is used to transmit the optical signal to the optical waveguide elements 34, 35. In more detail, a method of transmitting the optical signal between layers using the fiber or pipe block 40 according to the present invention comprises the steps of forming a plurality of opto-via holes 36 on the multi-layered PCB, embedding the fiber blocks into the opto-via holes 36, and connecting the optical waveguide elements 34, 35 mounted on the multi-layered PCB to the associated fiber blocks 40 using a reflecting mirror or a concave plate curved at a radian angle of 45 degrees.

At this time, the reflecting mirror may be a micro mirror on which silver (Au) or aluminum (Al) is coated.

Additionally, the fiber block may be replaced with the pipe block.

To sum up, the opto-via hole or cavity is formed on the multi-layered PCB, the fiber and pipe block 40 are embedded in the opto-via hole or cavity, the optical waveguide element 34, 35 and optical fiber 39 are attached to layers, and the resulting layers are then layered in a build-up method to accomplish the desired multi-layered PCB in which the optical signal is smoothly transmitted between layers.

In FIG. 3b, reference character E denotes a portion in which the optical signal is transmitted from the VCSEL 33 through the fiber or pipe block without the conventional micro-lens, and reference character D denotes a portion in which the fiber or pipe block is connected to the optical waveguide element.

Figure 4:
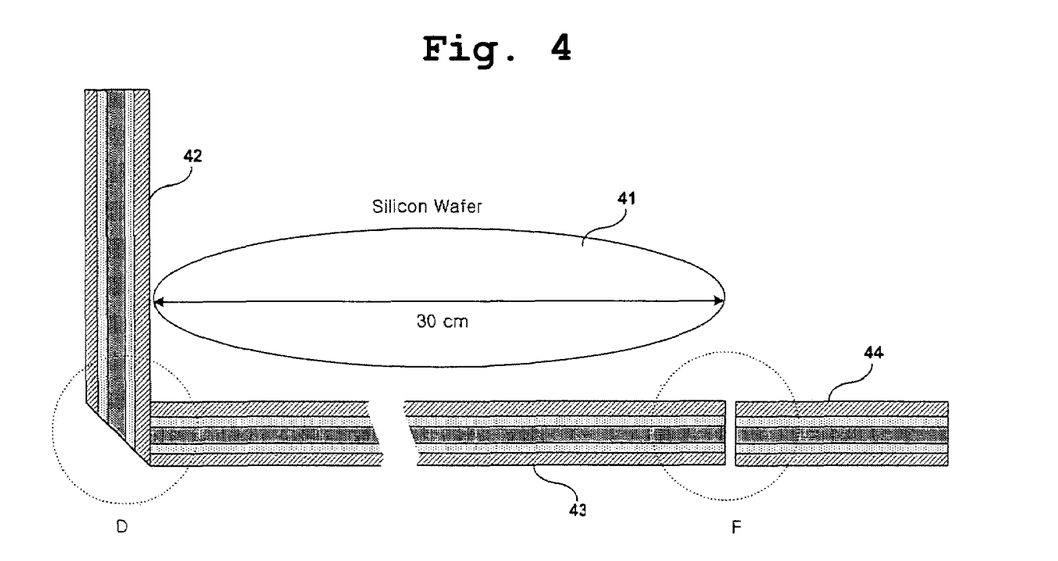
FIG. 4 schematically illustrates long-distance optical signal transmission throughout a longer distance than a silicone substrate in the optical multi-layered PCB according to the present invention.

FIG. 4 schematically illustrates long-distance optical signal transmission throughout a longer distance than a silicone substrate in the optical multi-layered PCB according to the present invention. A length of the optical waveguide element 43 should not be longer than a maximum length of the silicone substrate (the wafer) 41, that is, 30 cm, so there is needed another optical signal connection unit 44 such as the optical waveguide element, and the fiber or pipe block. At this time, reference numeral 42 denotes the fiber or pipe block, reference character D is same as that of FIG. 3b, and reference character F denotes a portion in which the optical signal connection units are connected to each other so as to transmit the optical signal across a long distance.

Figure 5:
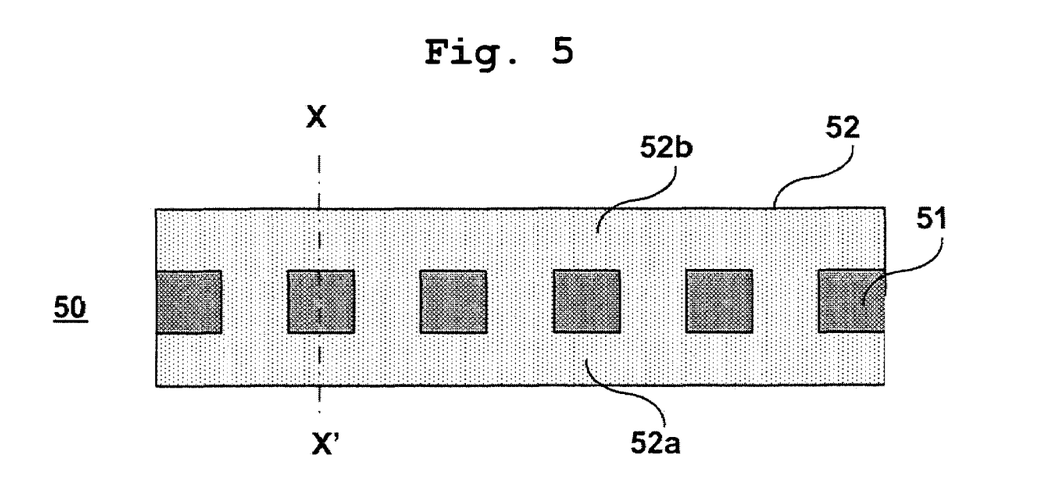
FIG. 5 is a sectional view of an optical waveguide element for optical signal transmission.

Turning now to FIG. 5, there is illustrated a sectional view of the optical waveguide element for optical signal transmission, in which the optical signal is transmitted through a low-loss multi-mode polymer waveguide core 51 of the optical waveguide element 50, and waveguide clads 52a, 52b are positioned at an upper and a lower portion of the polymer waveguide core 51.

There will be given a detailed description of the pipe block and the fiber block, illustrated in FIG. 6 and FIGS. 7a to 7c, according to the present invention.

Figure 6:
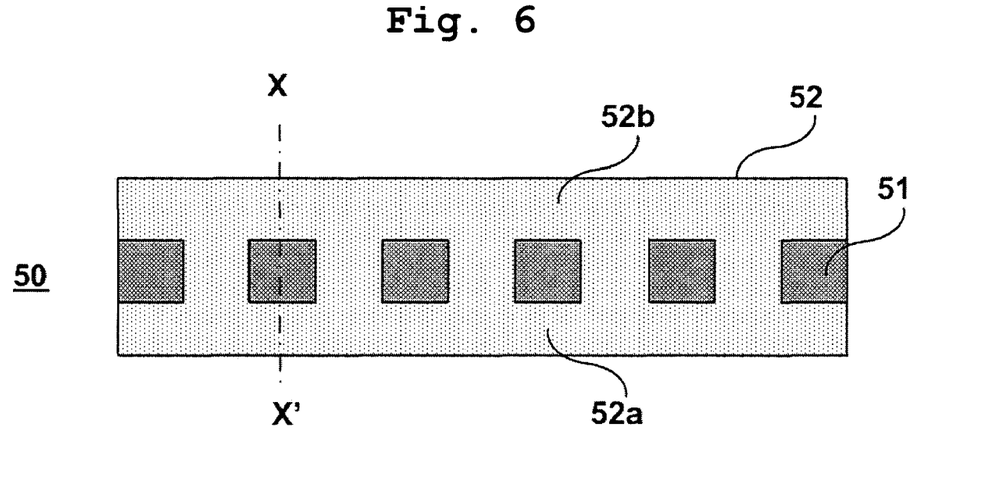
FIG. 6 is a sectional view of the pipe block for optical signal connection.

FIG. 6 is a sectional view of the pipe block for optical signal connection.

As in FIG. 6, the pipe block 60 comprises a) a underclad 61 acting as a medium for the optical waveguide, b) a core 62 having a plurality of pipe-shaped grooves positioned at regular intervals on the underclad 61, c) a plurality of optical fibers 63 embedded in the grooves, and d) an overclad 64 formed on the optical fibers 63. Each of the optical fibers consists of an optical fiber core 63a and an optical fiber clad 63b.

The core 62 of the pipe block 60 is made of a polymer, and does not function to transmit the optical signal, but to guide it. In other words, the core 62 is not the medium transmitting the optical signal, but just functions to support the optical fibers 63 to guide the optical signal. The underclad 61, the core 62, and the overclad 64 are sequentially layered to form a plurality of pipes, and the optical fibers 63 are then embedded into the pipe block 60.

At this time, the grooves in the core 62 may be formed by a laser ion etching method.

Further, the optical fibers 63 may be glass fibers, and preferably, plastic optical fibers (POF).

Furthermore, it is preferable that the overclad 64 is made of a Pyrex glass with light transmissivity of 95% or higher, or a polymer material. Additionally, the underclad 61 may consist of glass fibers with low refractivity acting as a medium for the optical waveguide.

Moreover, the optical fibers 63 may be cut at an angle of 45 or 90 degrees to perpendicularly connect the cut optical fibers to each other in a shape of "⌐" or "∟", and may be horizontally connected to the optical waveguide.

Figure 7A:
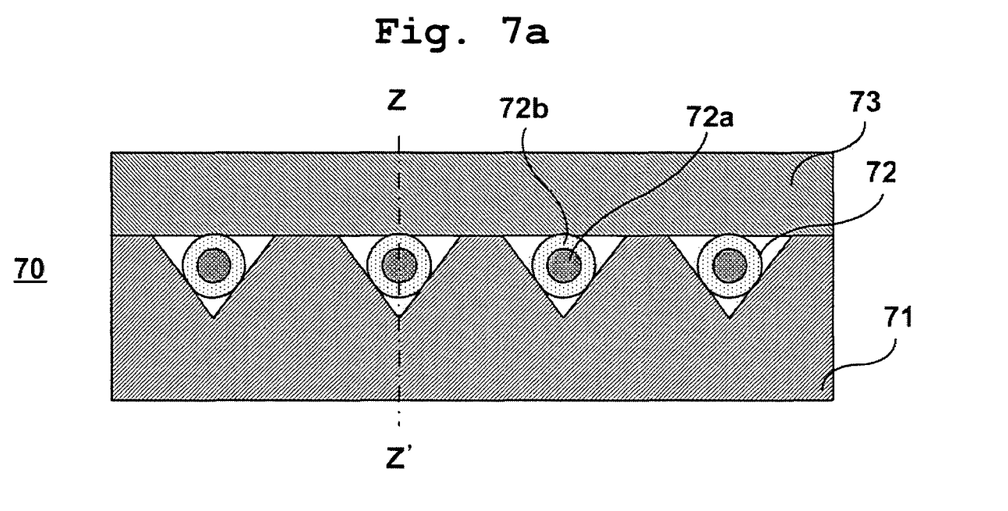
FIGS. 7a to 7c are sectional views of various fiber blocks, each of which has a plurality of V-shaped grooves for optical signal connection.
Figure 7B:
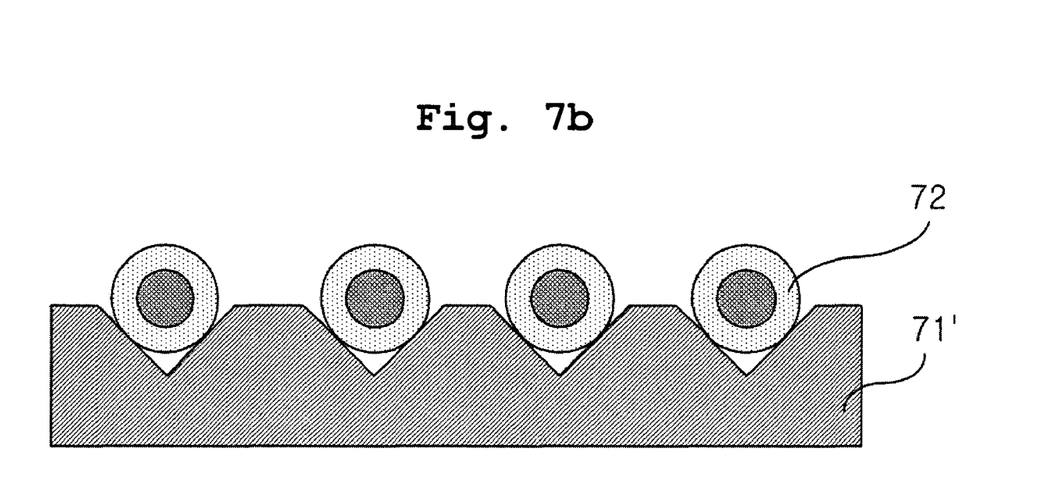
Figure 7C:
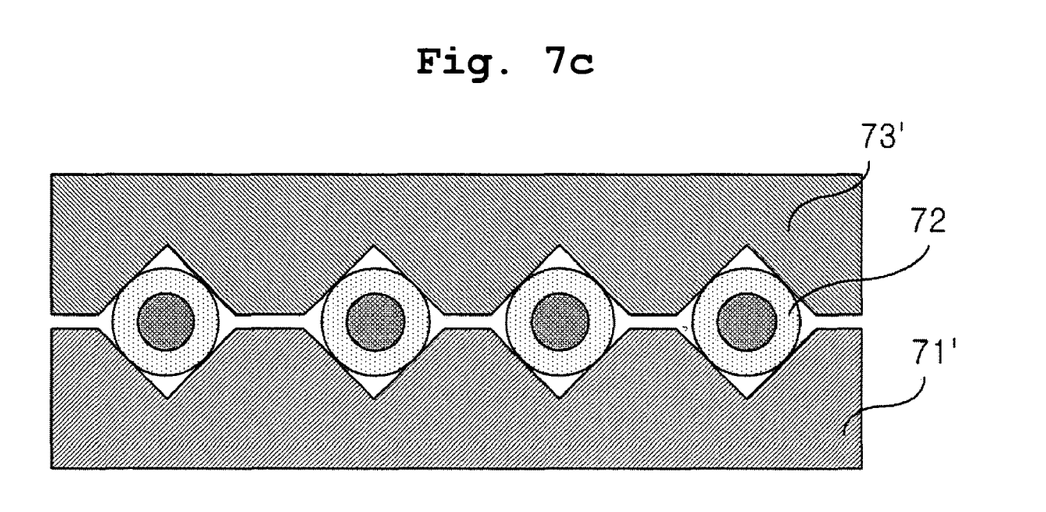

FIG. 7a is a sectional view of the fiber block for optical signal connection, in which V-shaped grooves are not formed at an upper block of the fiber block but at a lower block of the fiber block, FIG. 7b is a sectional view of the fiber block only having the lower block with the V-shaped grooves, and FIG. 7c is a sectional view of the fiber block, in which the V-shaped grooves are formed at the upper and lower block of the fiber block.

With reference to FIG. 7a, the fiber block according to the present invention, in the case of connecting the fiber block to the optical waveguide element so as to transmit the optical signal between layers of the multi-layered PCB, comprises a) the lower block 71 having a plurality of V-shaped grooves positioned at regular intervals, b) a plurality of optical fibers 72 embedded in the V-shaped grooves, and c) the upper block 73 formed on the optical fibers 72. At this time, each of the optical fibers 72 consists of an optical fiber core 72a and an optical fiber clad 72b.

Additionally, the lower block 71 consists of a silicone wafer or a polymer material, and the V-shaped grooves are formed by a laser ion etching method.

Further, the optical fibers 72 may be glass fibers, and preferably, plastic optical fibers. Furthermore, the optical fibers 72 may be replaced with the optical waveguide elements.

The upper block 73 may be made of the Pyrex glass with light transmissivity of 95% or higher, or the polymer material.

Moreover, the fiber block of FIG. 7b comprises only the lower block 71' without the upper block, unlike that of FIG. 7c.

Additionally, the fiber block of FIG. 7c comprises the upper block 73' and the lower block 71', and the upper block 73' has a plurality of V-shaped grooves corresponding in shape to those of the lower block 71'.

At this time, the optical fibers 72 may be cut at an angle of 45 or 90 degrees to perpendicularly connect the cut optical fibers to each other in a shape of "⌐" or "⌊", and may be horizontally connected to the optical waveguide element.

In detail, the V-shaped grooves are formed on the lower block, that is, Si substrate (silicone wafer) 71 constituting the fiber block, and the optical fibers 72 are embedded in the V-shaped grooves, so the fiber block of the present invention acts as the medium connecting the optical fibers 72 to the optical waveguide elements. In other words, the fiber block according to the present invention as shown in FIGS. 7a to 7c is structured such that it comprises the polymer or Si substrate 71 with the V-shaped grooves, is cut at an end thereof at an angle of 45 or 90 degrees and at the other end thereof at an angle of 90 or 45 degrees to form "⌐" or "⌊"-shaped fiber or pipe block, thereby vertically and smoothly connecting signals of different layers to each other and horizontally being connected to the optical waveguide element.

Meanwhile, a length of the silicone substrate 71, that is, the wafer, is 30 cm or less, so transmittance of the optical signal is conducted using the fiber ribbon in the case of transmitting the optical signal across a longer distance than 30 cm.

Therefore, the long-distance transmission of the optical signal is realized in such a way that the optical fiber is embedded in the core in the fiber and pipe block, or packaged by the fiber ribbon using a direct attachment connection method to extend a horizontal transmission length of the optical signal.

Hereinafter, there will be given a detailed description of the optical PCBs for long-distance signal transmission according to first to sixth embodiments of the present invention, as shown in FIGS. 8 to 13.

First Embodiment

Figure 8:
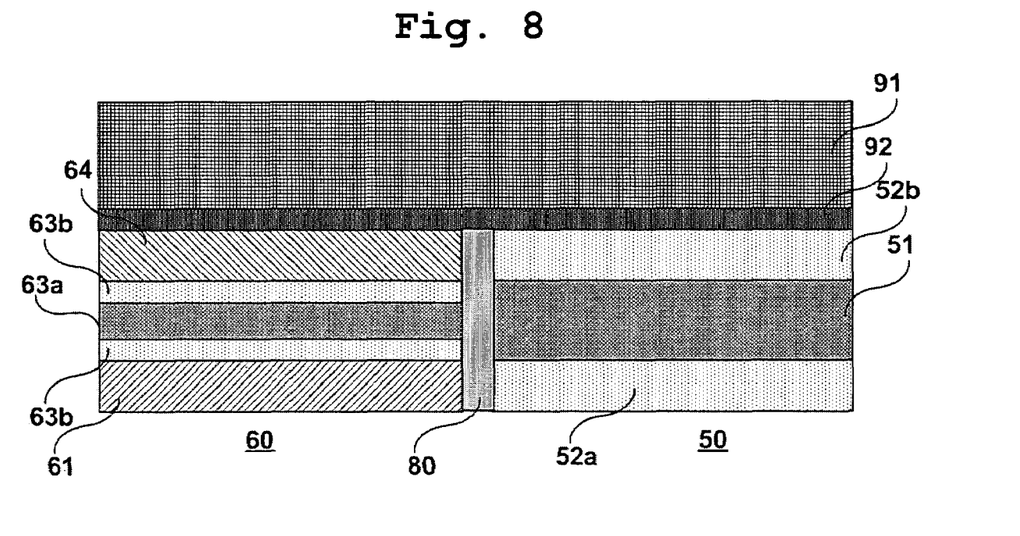
FIG. 8 illustrates an optical PCB for long-distance signal transmission according to a first embodiment of the present invention.

With reference to FIG. 8, there is illustrated an optical PCB for long-distance signal transmission according to the first embodiment of the present invention.

According to the first embodiment of the present invention, a pipe block 60 and an optical waveguide element 50 are attached to a base substrate consisting of a PCB insulating material 91 and a copper foil 92 in such a way that the pipe block 60 and the optical waveguide element 50 are horizontally connected to each other. At this time, a core 51 of the optical waveguide element 50 is thicker than an optical fiber core 63a of the pipe block 60.

The pipe block 60 is connected to the optical waveguide element 50 using an attachment member 80, and the attachment member 80 is made of a material capable of being cured by ultraviolet rays and having light transmissivity of 95% or higher.

In detail, a section of the optical waveguide element 50 taken along the line X–X' of FIG. 5 is connected to a section of the pipe block 60 taken along the line Y–Y' of FIG. 6 by the attachment member 80.

If any one of the optical waveguide element 50 and the pipe block 60 is used as a horizontal optical signal transmission member of the optical PCB, the other is used as an optical signal connection member of the optical PCB, thereby realizing long-distance transmission of an optical signal.

Second Embodiment

Figure 9:
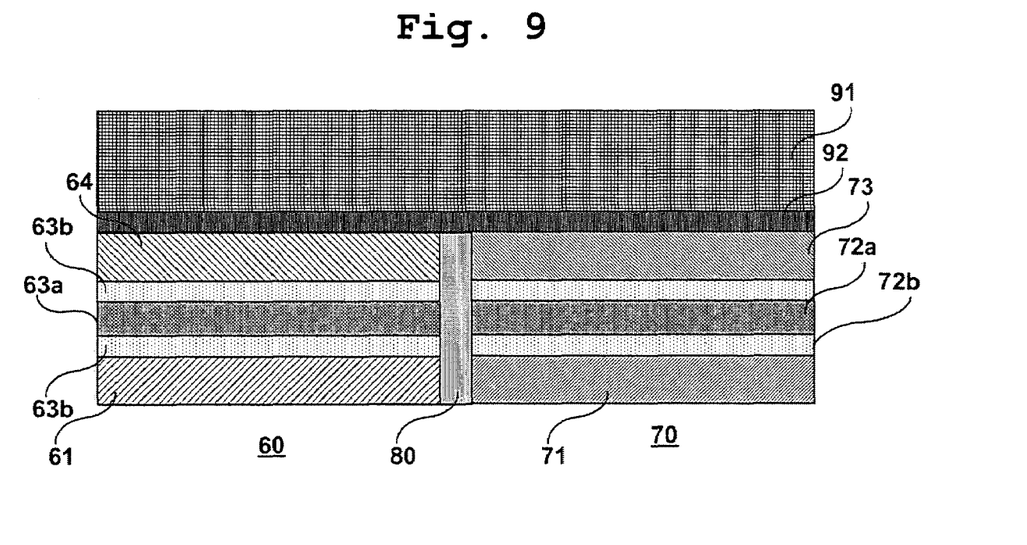
FIG. 9 illustrates an optical PCB for long-distance signal transmission according to a second embodiment of the present invention.

Referring to FIG. 9, there is illustrated an optical PCB for long-distance signal transmission according to the second embodiment of the present invention.

According to the second embodiment of the present invention, a, pipe block 60 and an fiber block 70 are attached to a base substrate consisting of a PCB insulating material 91 and a copper foil 92 in such a way that the pipe block 60 and the fiber block 70 are horizontally connected to each other.

The pipe block 60 is connected to the fiber block 70 using an attachment member 80, and the attachment member 80 is made of a material capable of being cured by ultraviolet rays and having light transmissivity of 95% or higher.

In detail, a section of the pipe block 60 taken along the line Y–Y' of FIG. 6 is connected to a section of the fiber block 70 taken along the line Z–Z' of FIG. 7a by the attachment member 80. At this time, a underclad 61 of the horizontal pipe block 60 has the same thickness as a lower block 71 of the fiber block 70, so first optical fibers 63a, 63b of the pipe block 60 and second optical fibers 72a, 72b of the fiber block 70 are horizontally connected to each other in such a way that the first and second optical fibers lie on the same axis.

If any one of the fiber block 70 and the pipe block 60 is used as a horizontal optical signal transmission member of the optical PCB, the other is used as an optical signal connection member of the optical PCB, thereby realizing long-distance transmission of an optical signal.

Third Embodiment

Figure 10:
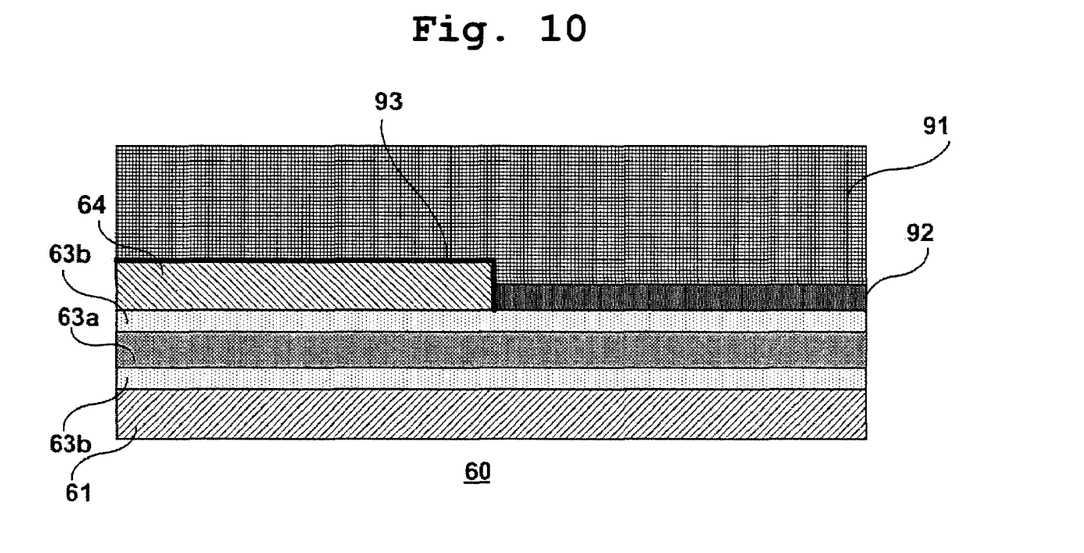
FIG. 10 illustrates an optical PCB for long-distance signal transmission according to a third embodiment of the present invention.

FIG. 10 illustrates an optical PCB for long-distance signal transmission according to the third embodiment of the present invention.

According to the third embodiment of the present invention, a horizontal pipe block 60 is attached to a base substrate consisting of a PCB insulating material 91 and a copper foil 92.

In detail, a stepped part 93 is formed from an opto-via hole by a length of the pipe block 60 in the optical multilayered PCB, and the pipe block 60 is embedded in the stepped part so as to expose optical fibers 63a, 63b in grooves of the pipe block 60 to the copper foil 92. At this time, the stepped part 93 is formed by a laser drill.

Accordingly, a length of the pipe block 60 is longer than a maximal diameter of a silicone substrate, 30 cm, thereby realizing long-distance transmission of an optical signal without a separate horizontal optical signal connection member and an attachment member.

Fourth Embodiment

Figure 11:
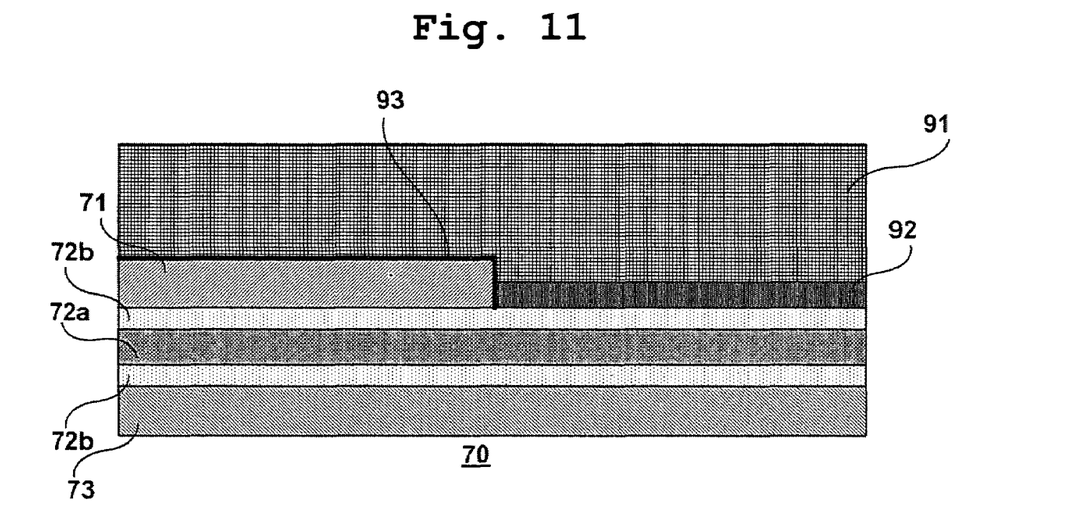
FIG. 11 illustrates an optical PCB for long-distance signal transmission according to a fourth embodiment of the present invention.

FIG. 11 illustrates an optical PCB for long-distance signal transmission according to the fourth embodiment of the present invention.

According to the fourth embodiment of the present invention, only a horizontal fiber block 70 is attached to a base substrate consisting of a PCB insulating material 91 and a copper foil 92.

In detail, a stepped part 93 is formed from an opto-via hole by a length of the fiber block 70 in the optical multi-layered PCB, and the fiber block 70 is embedded in the stepped part 93 so as to expose optical fibers 72a, 72b in V-shaped grooves of the fiber block 70 to the copper foil 92. At this time, the fiber block 70 embedded in the stepped part 93 of the PCB is attached to a lower block, that is, the silicone substrate 71. Furthermore, the stepped part 93 is formed by a laser drill.

Accordingly, a length of the fiber block 70 is longer than a maximum diameter of the silicone substrate, 30 cm, thereby realizing long-distance transmission of an optical signal without a separate horizontal optical signal connection member and an attachment member.

Fifth Embodiment

Figure 12:
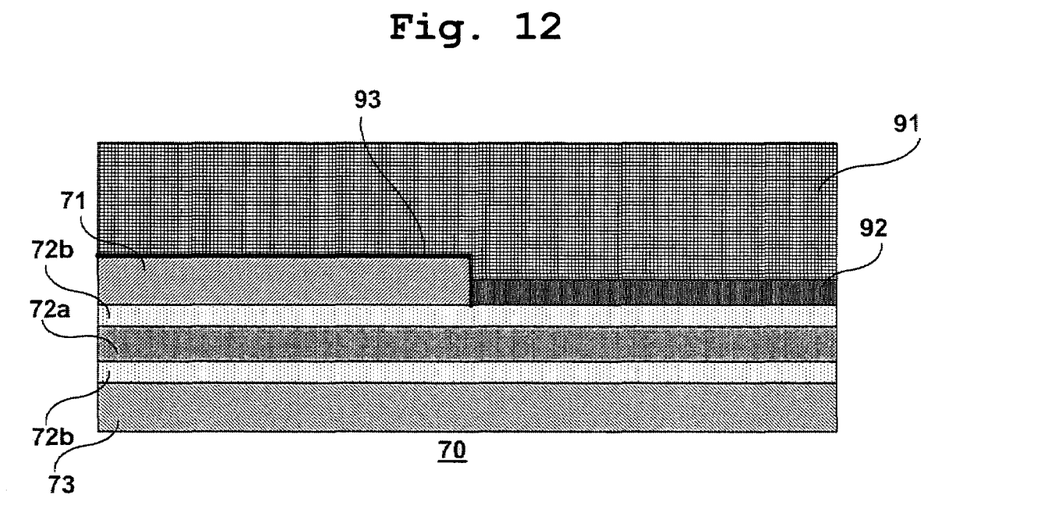
FIG. 12 illustrates an optical PCB for long-distance signal transmission according to a fifth embodiment of the present invention.

Referring to FIG. 12, there is illustrated an optical PCB for long-distance signal transmission according to the fifth embodiment of the present invention.

According to the fifth embodiment of the present invention, a fiber block 70 and an optical waveguide element 50 are attached to a base substrate consisting of a PCB insulating material 91 and a copper foil 92 in such a way that the fiber block 70 and the optical waveguide element 50 are horizontally connected to each other.

The fiber block 70 is connected to the optical waveguide element 50 using an attachment member 94, and the attachment member 94 is made of a material capable of being cured by ultraviolet rays and having light transmissivity of 95% or higher.

In detail, a section of the fiber block 70 taken along the line Z–Z' of FIG. 7a is connected to a section of the optical waveguide element 50 taken along the line X–X' of FIG. 5 by the attachment member 94.

Furthermore, a stepped part 93 is formed from an opto-via hole by a length of the fiber block 70 in the optical multi-layered PCB, and the fiber block 70 is embedded in the stepped part so as to expose optical fibers 72a, 72b in V-shaped grooves of the fiber block 70 to the copper foil 92. At this time, the fiber block 70 embedded in the stepped part 93 of the PCB is attached to a lower block, that is, a silicone substrate 71.

Accordingly, the optical fibers 72a, 72b embedded in the V-shaped grooves and the optical waveguide element 50 on the copper foil 92 of the PCB are horizontally connected to each other.

If any one of the fiber block 70 and the optical waveguide element 50 is used as a horizontal optical signal transmission member of the optical PCB, the other is used as an optical signal connection member of the optical PCB, thereby realizing long-distance transmission of an optical signal.

Sixth Embodiment

Figure 13:
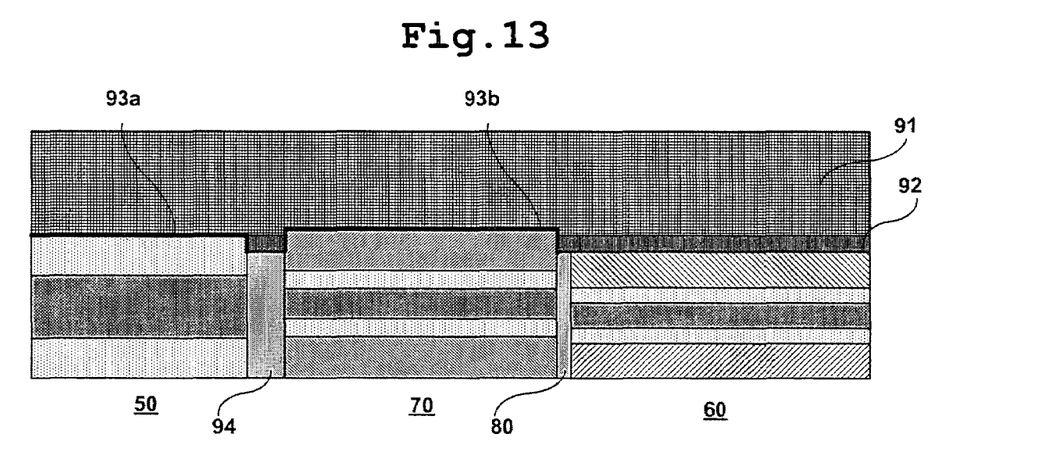
FIG. 13 illustrates an optical PCB for long-distance signal transmission according to a sixth embodiment of the present invention.

FIG. 13 illustrates an optical PCB for long-distance signal transmission according to the sixth embodiment of the present invention.

According to the sixth embodiment of the present invention, an optical waveguide element 50, a fiber block 70, and a pipe block 60 are attached to a base substrate consisting of a PCB insulating material 91 and a copper foil 92 in such a way that the optical waveguide element 50 and the pipe block 60 are horizontally connected to the fiber block 70 positioned between the optical waveguide element 50 and the pipe block 60.

The optical waveguide element 50 is connected to the fiber block 70 using the first attachment member 94 used in the fifth embodiment, and the fiber block 70 is connected to the pipe block 60 using the second attachment member 80. The first and second attachment member 94, 80 are all made of a material capable of being cured by ultraviolet rays and having light transmissivity of 95% or higher.

Further, a first stepped part 93a is formed from an opto-via hole by a length of the optical waveguide element 50 in the optical multi-layered PCB, and a second stepped part 93b is formed at a portion for connecting the fiber block 70 to the pipe block 60 to embed the fiber block 70 therein. At this time, a first optical fiber core of the pipe block 60, a second optical fiber core of the fiber block 70, and a core of the optical waveguide element 50 are horizontally connected to each other in such a way that their cores lie on the same axis.

Furthermore, a size of the core of the optical waveguide element 50 should be smaller than, or same as a total size of the fiber and pipe block 70, 60.

If any one of the optical waveguide element 50, the fiber block 70, and the pipe block 60 is used as a horizontal optical signal transmission member of the optical PCB, the others are used as optical signal connection members of the optical PCB, thereby realizing long-distance transmission of an optical signal.

Therefore, an optical PCB of the present invention is advantageous in that an optical waveguide, a pipe block, and a fiber block are horizontally and optionally arranged and attached to each other, thereby transmitting an optical signal across a longer distance than a length of a silicone substrate.

Other advantages of the optical PCB of the present invention are that the optical waveguide, the pipe block, and the fiber block are directly and optionally attached to each other to prevent misalignment between them, and optical fibers are easily and directly applied to a copper foil or an epoxy substrate to be desirably arranged.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. An optical printed circuit board for long-distance signal transmission, comprising:
   a) a base substrate including an insulating material, a copper foil, and an opto-via hole;
   b) an optical signal transmission member at least partially disposed in the opto-via hole and attached to the base substrate to horizontally transmit an optical signal;

c) an optical signal coupling block inserted into the opto-via hole and connected to the optical signal transmission member to transmit optical signals; and
d) an optical signal connection member horizontally connected to the optical signal transmission member to transmit the optical signal across a desired distance.

2. The optical printed circuit board as set forth in claim 1, further comprising an attachment member for attaching the optical signal transmission member to the optical signal connection member.

3. The optical printed circuit board as set forth in claim 2, wherein the attachment member is cured by ultra violet rays, and has light transmissivity of 95% or higher.

4. The optical printed circuit board as set forth in claim 1, wherein the optical signal transmission member is selected from the group consisting of an optical waveguide element, a pipe block, and a fiber block.

5. The optical printed circuit board as set forth in claim 1, wherein the optical signal connection member is selected from the group consisting of an optical waveguide element, a pipe block, and a fiber block.

6. The optical printed circuit board as set forth in claim 1, wherein the optical signal transmission member and the optical signal connection member are fixedly embedded in a stepped part of the base substrate.

7. The optical printed circuit board as set forth in claim 1, wherein a core of the optical signal transmission member lies on the same horizontal axis as that of the optical signal connection member.

8. The optical printed circuit board as set forth in claim 1, wherein at least one optical signal connection member is packaged by a fiber ribbon attached to the base substrate.

9. The optical printed circuit board as set forth in claim 1, further comprising an attachment member to transmit substantially all light, with a first face abutted against the optical signal transmission member and a second face abutted against the optical signal connection member.

10. An optical printed circuit board for long-distance signal transmission, comprising:
a) a base substrate including an insulating material, a copper foil, and an opto-via hole; and
b) an optical signal transmission member at least partially disposed in the opto-via hole and including a optical signal connection block with a plurality of grooves and optical fibers embedded in the grooves, and attached to the base substrate so as to realize horizontal transmission of an optical signal;
c) an optical signal coupling block inserted into the opto-via hole and connected to the optical signal transmission member to transmit optical signals;
whereby, said optical signal transmission member is partially embedded in the insulating material of the base substrate, and said optical fibers in the optical signal transmission member are partially exposed and attached to the copper foil of the base substrate.

11. The optical printed circuit board as set forth in claim 10, wherein the optical signal transmission member is selected from the group consisting of an optical waveguide element, a pipe block, and a fiber block.

12. The optical printed circuit board as set forth in claim 10, wherein the optical signal transmission member is fixedly embedded in a stepped part of the base substrate.

13. The optical printed circuit board as set forth in claim 10, wherein the optical signal transmission member is fixedly embedded in a stepped part of the base substrate that is abutted against the copper foil.

* * * * *